US012597739B2

(12) United States Patent
Lee

(10) Patent No.: US 12,597,739 B2
(45) Date of Patent: Apr. 7, 2026

(54) HIGH-FREQUENCY HIGH-SPEED TRANSMISSION CABLE MODULE AND UPPER COVER OF THE COVER BODY THEREOF

(71) Applicant: James Cheng Lee, La Habra, CA (US)

(72) Inventor: James Cheng Lee, La Habra, CA (US)

( * ) Notice: Subject to any disclaimer, the term of this patent is extended or adjusted under 35 U.S.C. 154(b) by 514 days.

(21) Appl. No.: 18/084,545

(22) Filed: Dec. 20, 2022

(65) Prior Publication Data

US 2023/0208080 A1    Jun. 29, 2023

Related U.S. Application Data

(60) Provisional application No. 63/294,071, filed on Dec. 27, 2021.

(30) Foreign Application Priority Data

Feb. 11, 2022    (CN) ......................... 202220280069.4
Oct. 20, 2022    (TW) ................................. 111139914

(51) Int. Cl.
*H01R 13/646*    (2011.01)
*H01R 13/66*    (2006.01)
*H05K 7/20*    (2006.01)

(52) U.S. Cl.
CPC ......... *H01R 13/646* (2013.01); *H01R 13/665* (2013.01); *H05K 7/2039* (2013.01)

(58) Field of Classification Search
None
See application file for complete search history.

(56) References Cited

U.S. PATENT DOCUMENTS

| | | | | |
|---|---|---|---|---|
| 10,551,581 | B2 * | 2/2020 | Khazen | ................ G02B 6/4269 |
| 10,617,037 | B2 * | 4/2020 | Lee | ..................... H05K 7/20409 |
| 2020/0288589 | A1 * | 9/2020 | Lavoie | ............... H05K 7/20163 |
| 2021/0072473 | A1 * | 3/2021 | Wall, Jr. | .................. H01L 23/42 |
| 2025/0071946 | A1 * | 2/2025 | Huang | ................. H05K 7/2039 |

* cited by examiner

*Primary Examiner* — Felix O Figueroa

(57) ABSTRACT

An upper cover of a cover body of a high-frequency high-speed transmission cable module is provided, including a main body and a heat dissipation block. Two end portions in the length direction of the main body are respectively defined as a first end portion and a second end portion, and the first end portion is provided with a through hole. The heat dissipation block is embedded in the through hole and exposed on the top surface of the first end portion. As such, the present invention can use the heat dissipation block to directly transfer heat to the heat dissipation fins without indirectly passing through the main body, so the heat dissipation efficiency is greatly improved.

9 Claims, 9 Drawing Sheets

Figure 1:
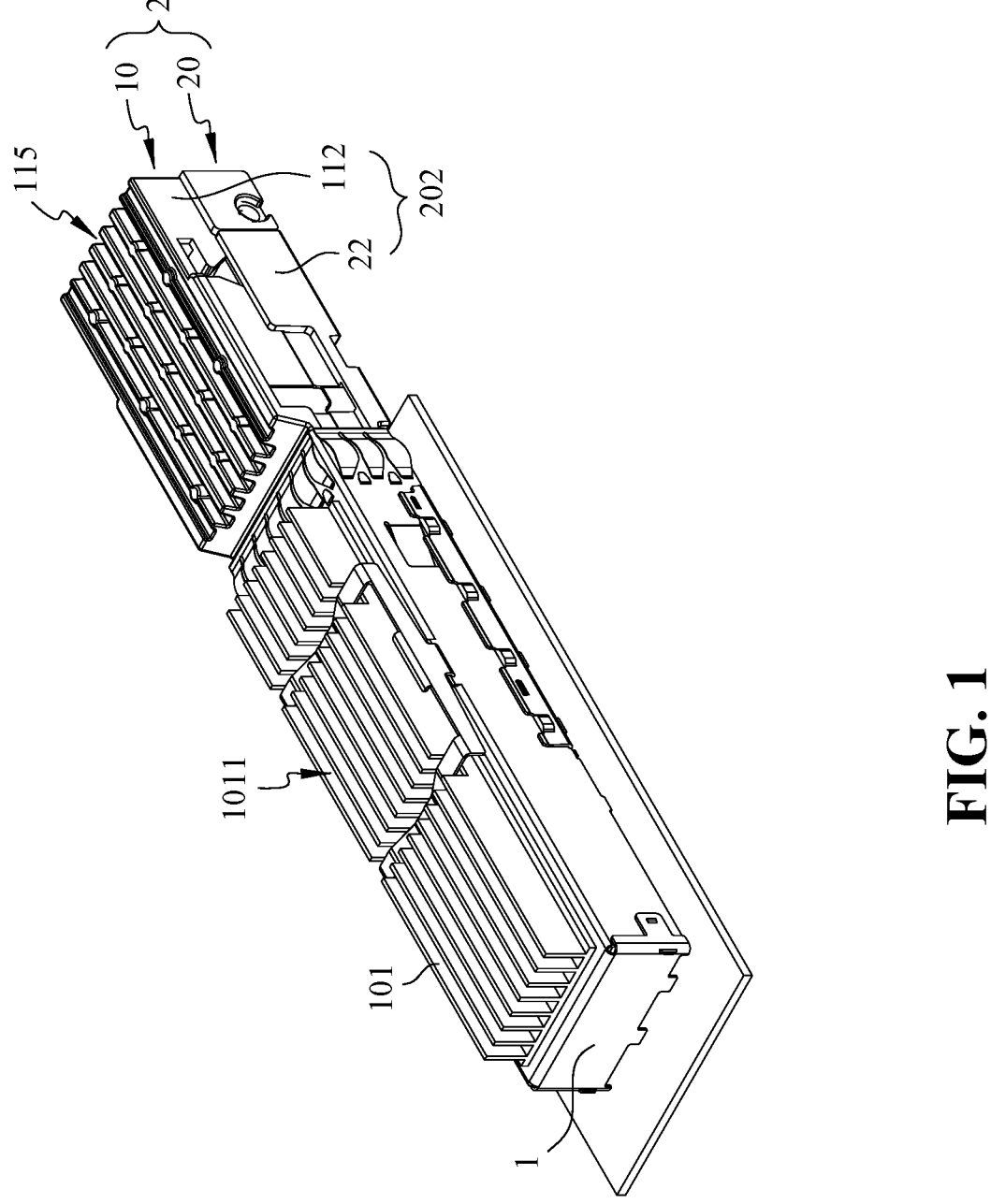

HIGH-FREQUENCY HIGH-SPEED TRANSMISSION CABLE MODULE AND UPPER COVER OF THE COVER BODY THEREOF

BACKGROUND OF THE INVENTION

1. Field of the Invention

The present invention relates generally to a high-frequency, high speed transmission cable module, and more particularly, to a high-frequency, high speed transmission cable module with high heat dissipation efficiency and the upper cover of the cover body thereof.

2. The Prior Arts

Small form-factor pluggable (SFP) transceiver, four-passage small form-factor pluggable (QSFP) transceiver, double-density four-passage small package pluggable (QSFP-DD) transceiver, or octal small form-factor pluggable (OSFP) transceiver are all hot-swappable cable components for high-frequency high-speed transmission cable module.

The known high-frequency high-speed transmission cable module includes a cover body and a control module. A second end portion of the cover body is used for accommodating one end of a cable therein, and the control module is arranged inside a first end portion of the cover body. As the control module of the high-frequency high-speed transmission cable module will generate heat during operation, a heat dissipation block is arranged inside the first end portion of the cover body. Moreover, the first end portion of the cover body is arranged in a casing, the heat generated by the control module during operation can be directly transferred to the heat dissipation block, the heat of the heat dissipation block will be transferred to the cover body, the heat of the cover body will be transferred to a plurality of heat dissipation fins of the casing, and finally, the heat dissipation fins will discharge the heat to the outside, to achieve the effect of heat dissipation.

However, the conventional heat dissipation method is to use the heat dissipation block to transfer heat to the heat dissipation fins of the casing indirectly through the cover body, so the heat dissipation efficiency is limited. The total data rate of the high-frequency high-speed transmission cable module includes 200G, 400G and 800G. The higher the total data rate, the higher the heat generated when the control module operates. For high-frequency high-speed transmission cable modules with a total data rate of 200G or 400G, the conventional heat dissipation methods can still sustain the control module and one end of the cable at an appropriate temperature because the heat generated by the control module is relatively low. Appropriate temperature can prevent the IC chip of the control module from reducing the working efficiency, increasing the bit error rate (BER) and decreasing the transmission rate of the cable. However, for the high-frequency high-speed transmission cable module with a total data rate of 800G, the conventional heat dissipation means are not enough to maintain the control module and one end of the cable at the appropriate temperature because the heat generated by the control module is relatively high, and the temperature of the control module and one end of the cable is easy to be too high, resulting in a decrease in the working efficiency of the IC chip of the control module, an increase in the bit error rate, and a decrease in the transmission speed of the cable.

SUMMARY OF THE INVENTION

A primary objective of the present invention is to provide a high-frequency high-speed transmission cable module and the upper cover of the cover body thereof, which can use the heat dissipation block to directly transfer heat to the heat dissipation fins without indirectly passing through the main body, so as to improve the heat dissipation efficiency.

In order to achieve the aforementioned objective, the present invention provides an upper cover of a cover body of a high-frequency high-speed transmission cable module, including a main body and a heat dissipation block; both end portions in the length direction of the main body are respectively defined as a first end portion and a second end portion, and a through hole is disposed at the first end portion of the main body, and the heat dissipation block is embedded in the through hole and exposed to top surface of the first end portion of the main body.

In a preferred embodiment, the second end portion of the main body defines a plurality of grooves.

In a preferred embodiment, the top surface of the second end portion of the main body is higher than the top surface of the first end portion of the main body.

In a preferred embodiment, the two sides along the length direction of the main body are respectively defined as a first side and a second side, the depth of the groove closest to the first side of the main body and the depth of the groove closest to the second side of the main body are both smaller than the depths of all the remaining grooves.

In a preferred embodiment, the depth of the remaining grooves is 1.5 mm.

In a preferred embodiment, a partition is disposed between two adjacent grooves, the partition has a plurality of protrusions, and the protrusions respectively protrude from both sides of the partition.

In a preferred embodiment, the positions of the plurality of protrusions on two adjacent partitions are staggered.

In a preferred embodiment, the protrusions are arranged in pairs.

In a preferred embodiment, the grooves are parallel to the length direction of the main body.

In a preferred embodiment, inner wall of the through hole is disposed with a protruding support portion, and the support portion divides the through hole into an upper passage and a lower passage, the upper passage runs through the top surface of the first end portion of the main body and the lower passage runs through the bottom surface of the first end portion of the main body, and the support portion is disposed with a connecting passage for communicating between the upper passage and the lower passage; wherein, the heat dissipation block includes an upper portion, a middle portion and a lower portion, and the upper portion of the heat dissipation block is located in the upper passage, the top surface of the upper portion of the heat dissipation block is exposed to the top surface of the first end portion of the main body, the outer side of the bottom surface of the upper portion of the heat dissipation block abuts against the top surface of the support portion, and the middle portion of the heat dissipation block is disposed at the bottom surface of the upper portion of the heat dissipation block and is located in the connecting passage; the lower portion of the heat dissipation block is disposed on the bottom surface of the middle portion of the heat dissipation block and is located in the lower passage, the diameter of the upper portion of the heat dissipation block is greater than the diameter of the middle portion of the heat dissipation block, and the diameter of the middle portion of the heat dissipation block is greater than the diameter of the lower portion of the heat dissipation.

In order to achieve the aforementioned objective, the present invention provides a high-frequency high-speed transmission cable module, including a cover and a control module; the cover body includes an upper cover and a lower cover, the upper cover includes a main body and a heat dissipation block, both end portions of the length direction of the main body are respectively defined as a first end portion and a second end portion, and both end portions of the bottom cover of the length direction are defined as a first end portion and a second end portion; the first end portion of the main body and the first end portion of the lower cover together form a first end portion of the cover body, the second end portion of the main body and the second end portion of the lower cover together form a second end portion of the cover body, the second end portion of the cover body is used for accommodating one end of a cable therein, the first end portion of the main body is disposed with a through hole, and the heat dissipation block is embedded in the through hole and exposed to top surface of the first end portion of the main body; the control module is disposed inside the first end portion of the cover body and is located under the heat dissipation block.

In a preferred embodiment, the second end portion of the main body defines a plurality of grooves.

In a preferred embodiment, the top surface of the second end portion of the main body is higher than the top surface of the first end portion of the main body.

In a preferred embodiment, the two sides along the length direction of the main body are respectively defined as a first side and a second side, the depth of the groove closest to the first side of the main body and the depth of the groove closest to the second side of the main body are both smaller than the depths of all the remaining grooves.

In a preferred embodiment, the depth of the remaining grooves is 1.5 mm.

In a preferred embodiment, a partition is disposed between two adjacent grooves, the partition has a plurality of protrusions, and the protrusions respectively protrude from both sides of the partition.

In a preferred embodiment, the positions of the plurality of protrusions on two adjacent partitions are staggered.

In a preferred embodiment, the protrusions are arranged in pairs.

In a preferred embodiment, inner wall of the through hole is disposed with a protruding support portion, and the support portion divides the through hole into an upper passage and a lower passage, the upper passage runs through the top surface of the first end portion of the main body and the lower passage runs through the bottom surface of the first end portion of the main body, and the support portion is disposed with a connecting passage for communicating between the upper passage and the lower passage; wherein, the heat dissipation block includes an upper portion, a middle portion and a lower portion, and the upper portion of the heat dissipation block is located in the upper passage, the top surface of the upper portion of the heat dissipation block is exposed to the top surface of the first end portion of the main body, the outer side of the bottom surface of the upper portion of the heat dissipation block abuts against the top surface of the support portion, and the middle portion of the heat dissipation block is disposed at the bottom surface of the upper portion of the heat dissipation block and is located in the connecting passage; the lower portion of the heat dissipation block is disposed on the bottom surface of the middle portion of the heat dissipation block and is located in the lower passage, the diameter of the upper portion of the heat dissipation block is greater than the diameter of the middle portion of the heat dissipation block, and the diameter of the middle portion of the heat dissipation block is greater than the diameter of the lower portion of the heat dissipation; and wherein the control module is located under the lower portion of the heat dissipation block.

The effect of the present invention is that the present invention can utilize the heat dissipation block to directly transfer heat to the heat dissipation fins without indirectly passing through the main body, and therefore the heat dissipation efficiency is greatly improved.

BRIEF DESCRIPTION OF THE DRAWINGS

The present invention will be apparent to those skilled in the art by reading the following detailed description of a preferred embodiment thereof, with reference to the attached drawings, in which:

FIG. 1 is a perspective view of the high-frequency high-speed transmission cable module of the present invention;

FIG. 2 is an exploded view of the high-frequency high-speed transmission cable module of the present invention;

FIG. 3 is a cross-sectional view of the high-frequency high-speed transmission cable module of the present invention;

FIG. 4 is a perspective view of the upper cover of the cover body of the high-frequency high-speed transmission cable module of the present invention;

FIG. 5 is an exploded view of the upper cover of the cover body of the high-frequency high-speed transmission cable module of the present invention;

FIG. 6 is a top view of the upper cover of the cover body of the high-frequency high-speed transmission cable module of the present invention;

FIG. 7 is a side view of the upper cover of the cover body of the high-frequency high-speed transmission cable module of the present invention;

FIG. 8 is a comparison chart of the test results between the present invention and the conventional technology under the condition that the ambient temperature is 25° C. and the fan speed is 20 RPM; and FIG. 9 is a comparison chart of the test results between the present invention and the conventional technology under the condition that the ambient temperature is 55° C. and the fan speed is 20 RPM.

DETAILED DESCRIPTION OF THE PREFERRED EMBODIMENT

The accompanying drawings are included to provide a further understanding of the invention, and are incorporated in and constitute a part of this specification. The drawings illustrate embodiments of the invention and, together with the description, serve to explain the principles of the invention.

FIG. 1-3 are respectively a perspective view, an exploded view and a cross-sectional view of the high-frequency high-speed transmission cable module of the present invention. As shown in FIGS. 1-3, the present invention provides a high-frequency high-speed transmission cable module, which includes a cover body 2 and a control module 3. The cover body 2 includes an upper cover 10 and a lower cover 20. The upper cover 10 includes a main body 11 and a heat dissipation block 12. The two end portions of the length direction of the main body 11 respectively are defined as a first end portion 111 and a second end portion 112, the two ends of the length direction of the lower cover 20 are respectively defined as a first end portion 21 and a second end portion 22, the first end portion 111 of the main body 11 and the first end portion 21 of the lower cover 20 together form a first end portion 201 of the cover body 2, and the second end portion 112 of the main body 11 and the second end portion 22 of the lower cover 20 together form a second end portion 202 of the cover body 2. The second end portion 202 of the cover body 2 is used for accommodating an end of a cable (not shown) therein. The first end portion 111 of the main body 11 is disposed with a through hole 113, and the heat dissipation block 12 is embedded in the through hole 113 and exposed on the top surface of the first end portion 111 of the main body 11. The control module 3 is disposed inside the first end portion 201 of the cover body 2 and is located below the heat dissipation block 12.

Figure 2:
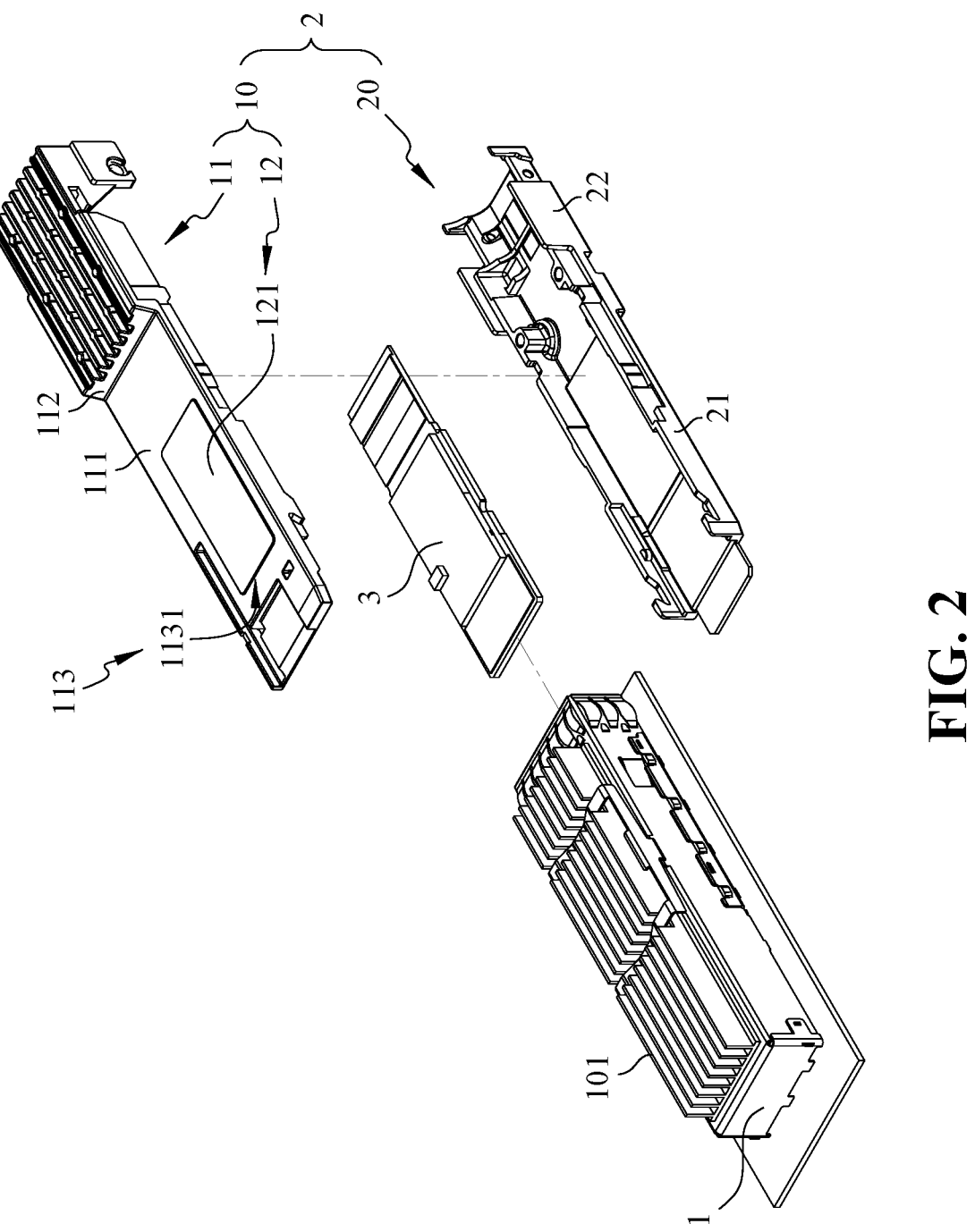
Figure 3:
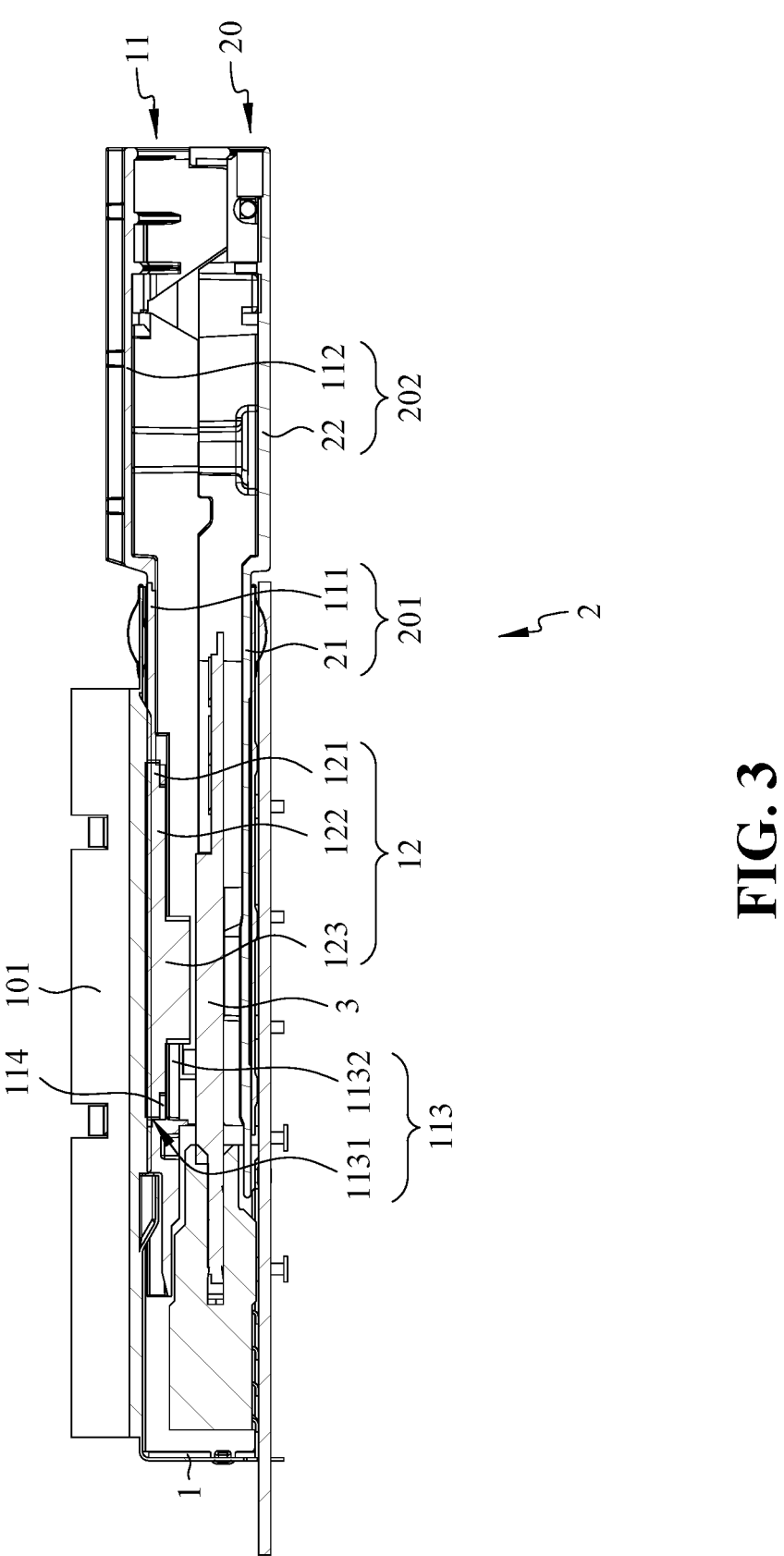

As shown in FIGS. 1 to 3, in actual use, the first end portion 201 of the cover body 2 is disposed in a casing 1 such that the heat dissipation block 12 contacts a plurality of heat dissipation fins 101 of the casing 1.

The heat generated during the operation of the control module 3 will be transferred to the heat dissipation block 12, then the heat of the heat dissipation block 12 will be transferred to the heat dissipation fins 101, and finally the heat dissipation fins 101 will discharge the heat to achieve the effect of heat dissipation. Compared with the conventional technology, the present invention can use the heat dissipation block 12 to directly transfer heat to the heat dissipation fins 101 without transmission through the main body 11, so the heat dissipation efficiency is greatly improved. Whether it is a high-frequency high-speed transmission cable module with a total data rate of 200G, 400G, or 800G, the heat dissipation means of the present invention is sufficient to maintain the control module 3 and one end of the cable at an appropriate temperature, preventing the IC chip of the control module 3 from reducing work efficiency, increasing the bit error rate and decreasing the transmission rate of the cable decreases.

Figure 4:
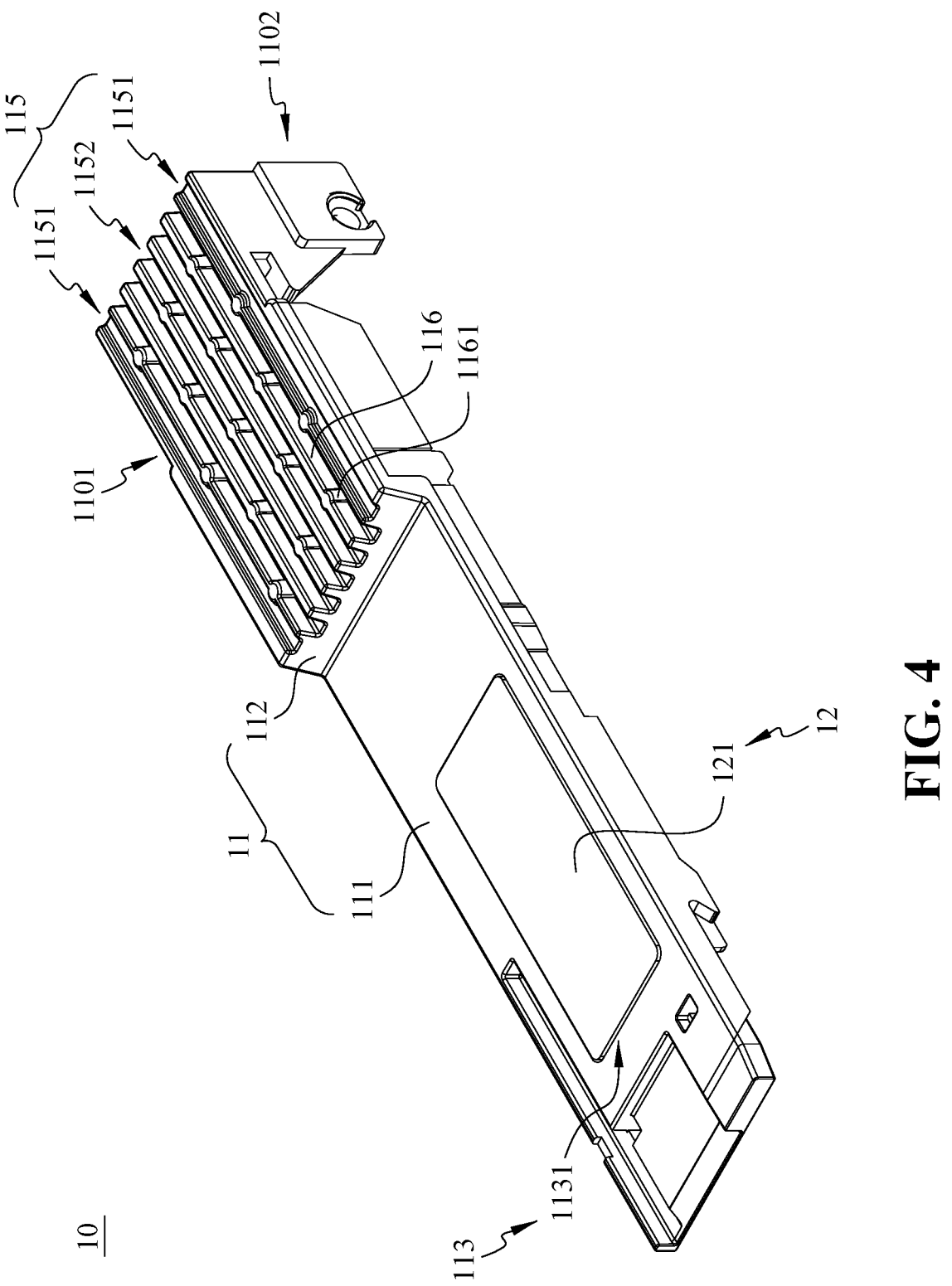
Figure 5:
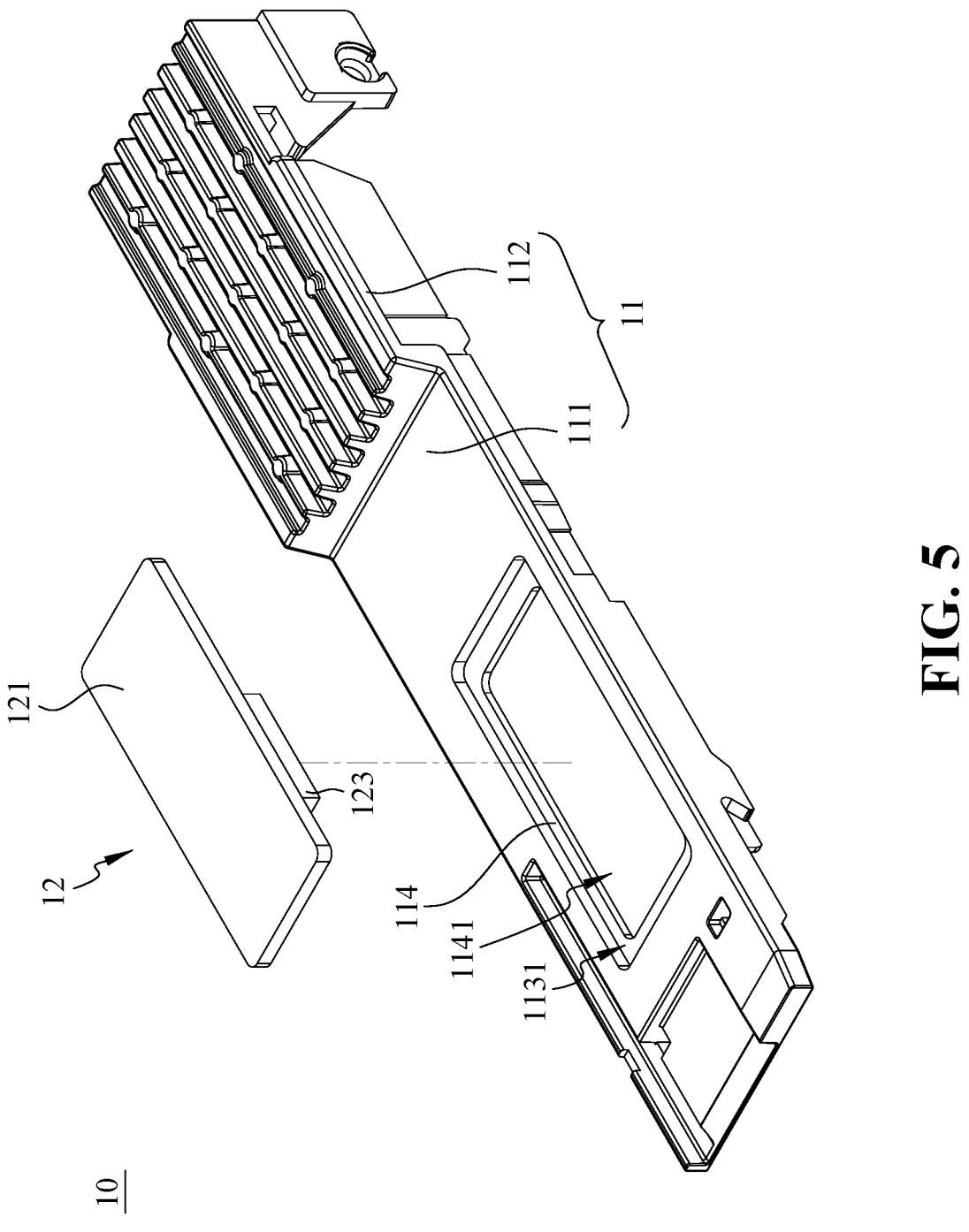

FIGS. 4-7 are respectively a perspective view, an exploded view, a top view, and a side view of the upper cover 10 of the cover body of the high-frequency high-speed transmission cable module of the present invention. As shown in FIG. 3 and FIG. 5, in a preferred embodiment, a support portion 114 protrudes from the inner sidewall of the through hole 113, and the support portion 114 divides the through hole 113 into an upper passage 1131 and a lower passage 1132, the upper passage 1131 runs through the top surface of the first end portion 111 of the main body 11, and the lower passage 1132 runs through the bottom surface of the first end portion 111 of the main body 11. The support portion 114 is disposed with a connecting passage 1141, and the connecting passage 1141 communicates with the upper passage 1131 and the lower passage 1132. As shown in FIG. 3, FIG. 4 and FIG. 5, the heat dissipation block 12 includes an upper portion 121, a middle portion 122 and a lower portion 123, the upper portion 121 is located in the upper passage 1131, the top surface of the upper portion 121 is exposed on the top surface of the first end portion 111 of the main body 11, the bottom surface of the edge portion of the upper portion 121 abuts against the top surface of the support portion 114, and the middle portion 122 is arranged on the bottom surface of the upper portion 121 and is also located in the connecting passage 1141. The lower portion 123 is arranged on the bottom surface of the middle portion

122 and is located in the lower passage 1132. The diameter of the upper portion 121 is larger than the diameter of the middle portion 122, and the diameter of the middle portion 122 is greater than the diameter of the lower portion 123. As shown in FIG. 3, the control module 3 is located under the lower portion 123 of the heat dissipation block 12, and the top surface of the upper portion 121 contacts the heat dissipation fins 101. Thereby, the support portion 114 can support the upper portion 121 so that the heat dissipation block 12 an be easily installed in the through hole 113. Furthermore, the lower portion 123 is aligned with the control module 3 and its diameter is smaller than the diameter of the upper portion 121 and the diameter of the middle portion 122 so that it can quickly absorb the heat generated by the control module 3 during operation and improve the heat dissipation efficiency. In addition, the overall structure of the heat dissipation block 12 is in an inverted stepped shape, the topmost surface of the control module 3 has a diameter greater than the diameter of the lower portion 123 and a portion of the bottom surface of the middle portion 122 is exposed directly above the control module 3. As a result, the heat can be evenly diffused from part of the bottom surface of the middle portion 122 and the lower portion 123 to the upper portion 121 through the middle portion 122, thereby improving heat dissipation efficiency. Moreover, the top surface of the upper portion 121 has a larger contact area, so that the heat can be transferred to the heat dissipation fins 101 evenly and quickly, thereby improving heat dissipation efficiency.

As shown in FIGS. 4-7, in a preferred embodiment, the second end portion 112 of the main body 11 is disposed with a plurality of grooves 115. The heat generated during the operation of the control module 3 will also be absorbed by the first end portion 111 of the main body 11, and the first end portion 111 of the main body 11 will transfer the heat to the second end portion 112 of the main body 11. The grooves 115 provide a larger heat dissipation area, so that the airflow passing through the grooves 115 can carry more heat away and improve the heat dissipation efficiency.

As shown in FIG. 4, in a preferred embodiment, the top surface of the second end portion 112 of the main body 11 is higher than the top surface of the first end portion 111 of the main body 11. Therefore, the second end portion 112 of the main body 11 has sufficient thickness to form the grooves 115, and the second end portion 112 of the main body 11 can provide a sufficient internal space for accommodating one end of the cable.

Figure 7:
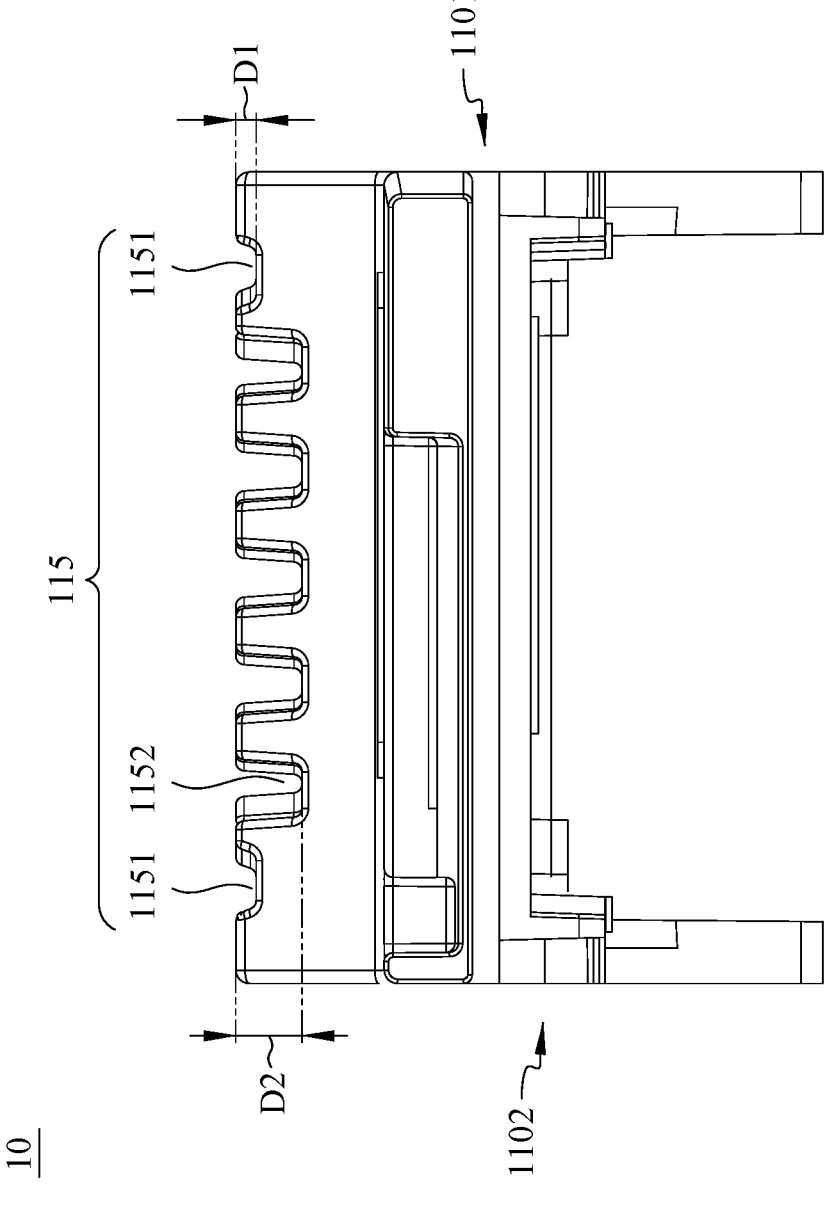

As shown in FIG. 4 and FIG. 7, in a preferred embodiment, the two sides along the length direction of the main body 11 are respectively defined as a first side 1101 and a second side 1102. The groove 1151 closest to the first side 1101 of the main body 11 has a depth D1 and the groove 1151 closest to the second side 1102 of the main body 11 also has a depth D1, and D1 is smaller than the depth D2 of the remaining grooves 1152. More specifically, the depth D1 of the groove 1151 closest to the first side 1101 of the main body 11 and the depth D1 of the groove 1151 closest to the second side 1102 of the main body 11 must not be too deep, otherwise the thickness of the first side 1101 of the main body 11 and the thickness of the second side 1102 will not be enough to combine with the first side and the second side of the lower cover 20 respectively. Therefore, the depth D1 of the groove 1151 closest to the first side 1101 of the main body 11 and the depth D1 of the groove 1151 closest to the second side 1102 of the main body needs to be made shallow so that the first side 1101 and the second side 1102 of the main body 11 have enough thickness to combine with the first side and the second side of the lower cover 20 respectively.

Since the depth D2 of the remaining grooves 1152 will affect the heat dissipation efficiency and the internal space of the second end portion 112 of the main body 11, the present invention conducted a test for heat dissipation efficiency, and the test results are described as follows.

Test condition I: the depth D2 of the remaining grooves 1152 is less than 1.5 mm. Pros: the depth D2 allows the internal space of the second end portion 112 of the main body 11 to have sufficient height, without causing internal interference, and without excessive pressure on one end of the cable. Cons: The depth D2 will cause insufficient heat dissipation area, reduce heat dissipation efficiency, increase the risk of lower working efficiency of the IC chip of the control module 3, increase bit error rate, and decrease the transmission rate of the cable.

Test condition II: the depth D2 of the remaining grooves 1152 is greater than 1.5 mm. Pros: The depth D2 can increase the heat dissipation area and improve the heat dissipation efficiency. Cons: the depth D2 will compress the height of the internal space of the second end portion 112 of the main body 11, causing internal interference, and even over-pressing one end of the cable.

Test condition III: the depth D2 of the remaining grooves 1152 is 1.5 mm. Pros: the depth D2 allows the internal space of the second end portion 112 of the main body 11 to have a sufficient height, without causing internal interference, and without excessive pressure on one end of the cable; and the depth D2 can increase the heat dissipation area and improve the heat dissipation efficiency. In other words, the test condition III can have the advantages of the test condition I and the test condition II at the same time without the disadvantages of the test condition I and the test condition II, and the efficacy is good.

Figure 6:
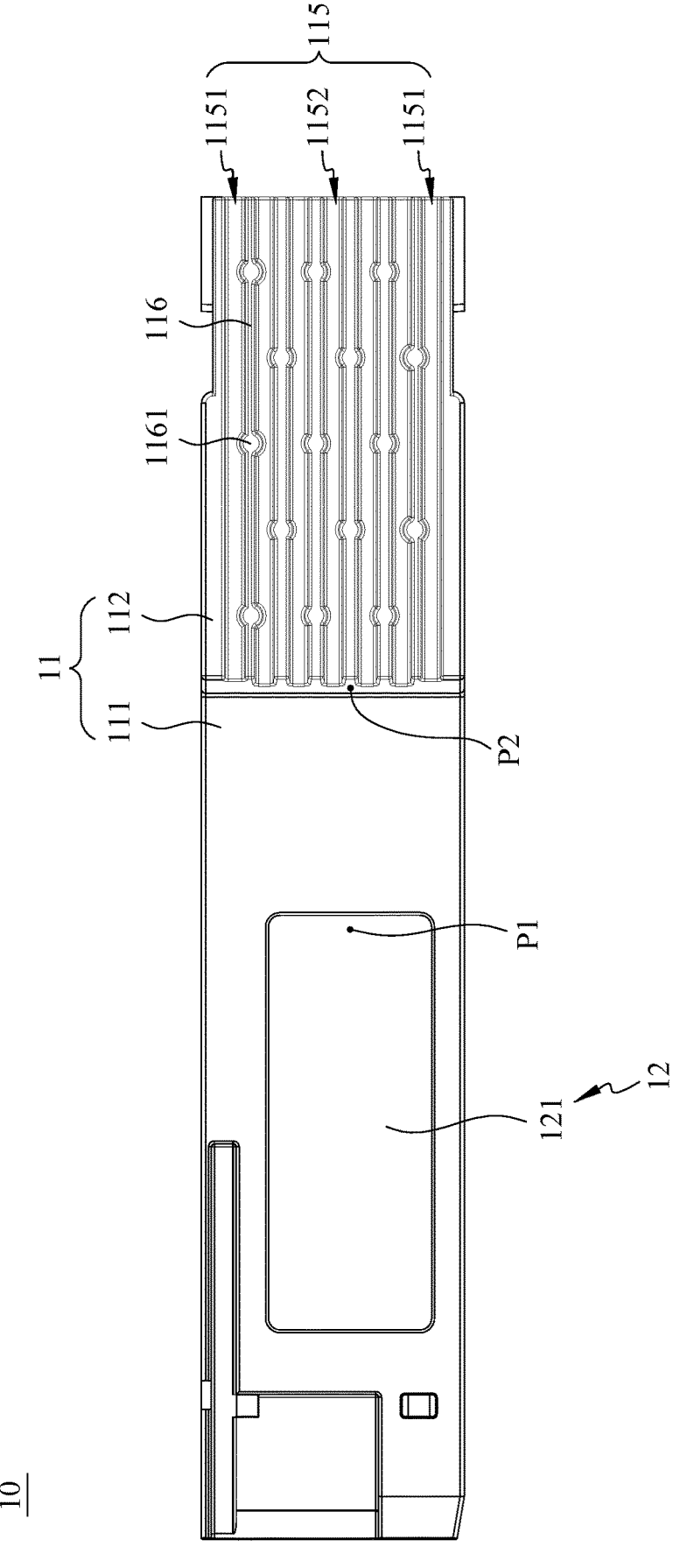

As shown in FIG. 4 and FIG. 6, in a preferred embodiment, a partition 116 is disposed between two adjacent grooves 115, and the partition 116 has a plurality of protrusions 1161. These protrusions 1161 respectively protrude from both sides of the partition 116. Thereby, the protrusions 1161 can increase the heat dissipation area of the partition 116 and improve the heat dissipation efficiency. Preferably, the positions of the plurality of protrusions 1161 of the two adjacent partitions 116 are staggered, so as to prevent the plurality of protrusions 1161 of the two adjacent partitions 116 from being too close to hinder the airflow, thereby affecting the heat dissipation efficiency. Preferably, the protrusions 1161 are arranged in pairs, for easy manufacturing.

As shown in FIG. 1, in a preferred embodiment, the grooves 115 are parallel to the length direction of the main body 11 and the length direction of the heat dissipation fins 101. Accordingly, the airflow can flow along the grooves 115 and a plurality of channels 1011 of the heat dissipation fins 101 to improve heat dissipation efficiency.

In a preferred embodiment, the heat dissipation block 12 is made of copper. However, it is not limited thereto, and the material of the heat dissipation block can be any material with high thermal conductivity.

The high-frequency high-speed transmission cable module shown in the aforementioned figures is a quad small form-factor pluggable-double density (QSFP-DD) transceiver. However, it is not limited thereto. In some embodiments, the high-frequency high-speed transmission cable module may also be a small form-factor pluggable (SFP) transceiver, a quad small form-factor pluggable, (QSFP) transceiver, or an octal small form-factor pluggable (OSFP)

transceiver. The above-mentioned high-frequency high-speed transmission cable modules are all hot-swappable high-frequency high-speed transmission cable modules.

Figure 8:
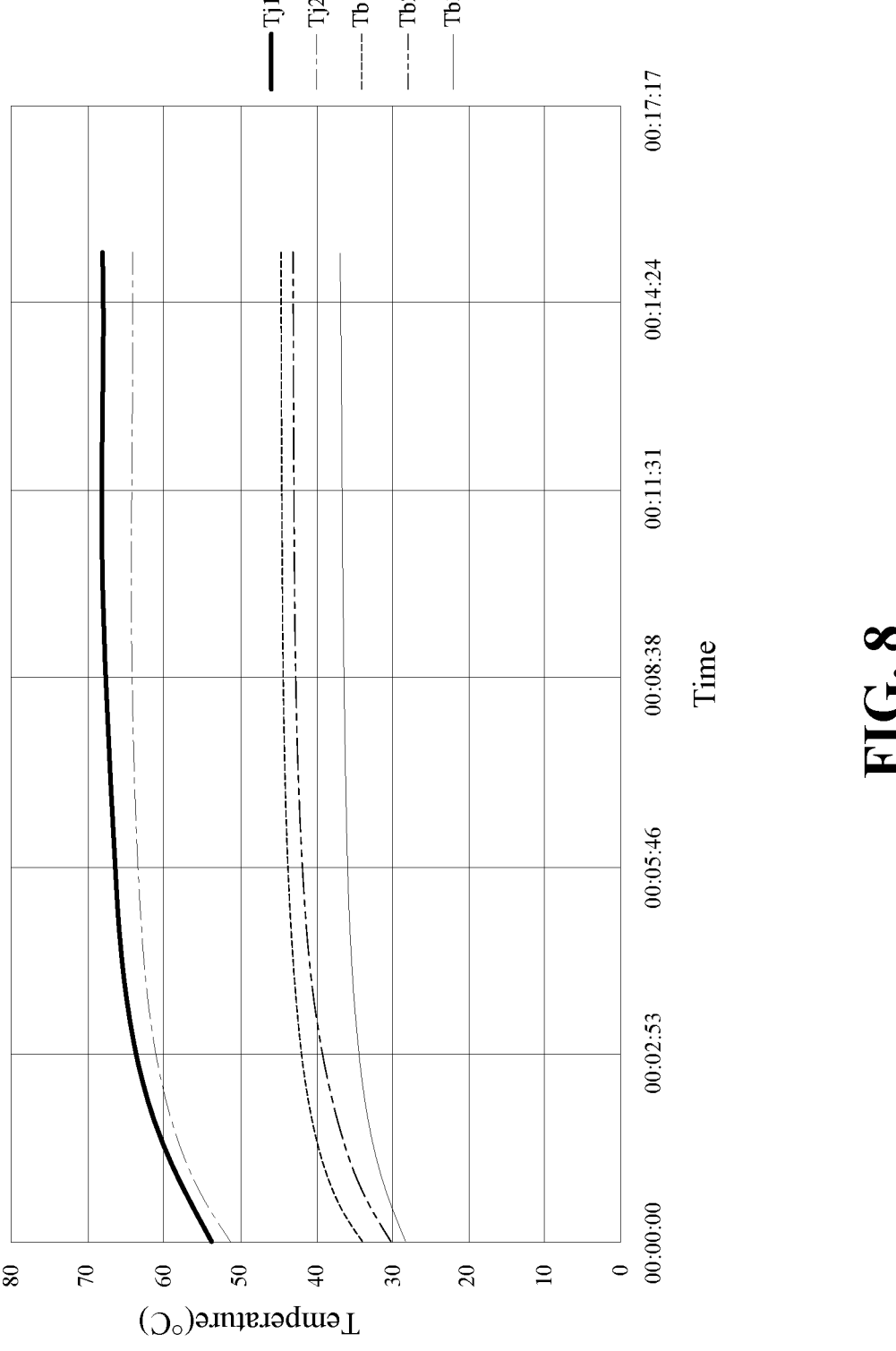

FIG. 8 is a comparison chart of the test results between the present invention and the conventional technology under the condition that the ambient temperature is 25° C. and the fan speed is 20 RPM. Tj1 is the core temperature of the IC chip of the control module of a conventional high-frequency high-speed transmission cable module, Tj2 is the core temperature of the IC chip of the control module 3 of the high-frequency high-speed transmission cable module of the present invention, Tb1 is the temperature of a measurement point P1 of the heat dissipation block of the upper cover of the high-frequency high-speed transmission cable module of the present invention, Tb2 is the temperature of the first end portion of the main body of the upper cover of the conventional high-frequency high-speed transmission cable module, and Tb3, is the temperature at a measuring point P2 at the first end portion of the main body of the upper cover of the high-frequency high-speed transmission cable module of the present invention. As shown in FIG. 8, Tj1>Tj2, and Tb1>Tb2>Tb3. The above results show that under the conditions of an ambient temperature of 25° C. and a fan speed of 20 RPM, the heat dissipation efficiency of the present invention is significantly better than that of the conventional technology.

More specifically, as shown in FIG. 8, during the start-up period (i.e., before 2 minutes and 53 seconds), the core temperature of the IC chip is still rising because the heat generated by the control module is still accumulating. At this time, $\text{Tj1}-\text{Tj2} \geq 2° \text{C.}$, the difference between Tb1 and Tb2 is larger, and the difference between Tb2 and Tb3 is smaller. As shown in FIG. 8, during the equilibrium period (i.e., after 14 minutes and 24 seconds), the core temperature of the IC chip will not rise again because the heat generated during the operation of the control module reaches the equilibrium state. At this time, $\text{Tj1}-\text{Tj2} \geq 4° \text{C.}$, the difference between Tb1 and Tb2 is smaller ($\text{Tb1}-\text{Tb2} \geq 1° \text{C.}$), and the difference between Tb2 and Tb3 is larger.

Figure 9:
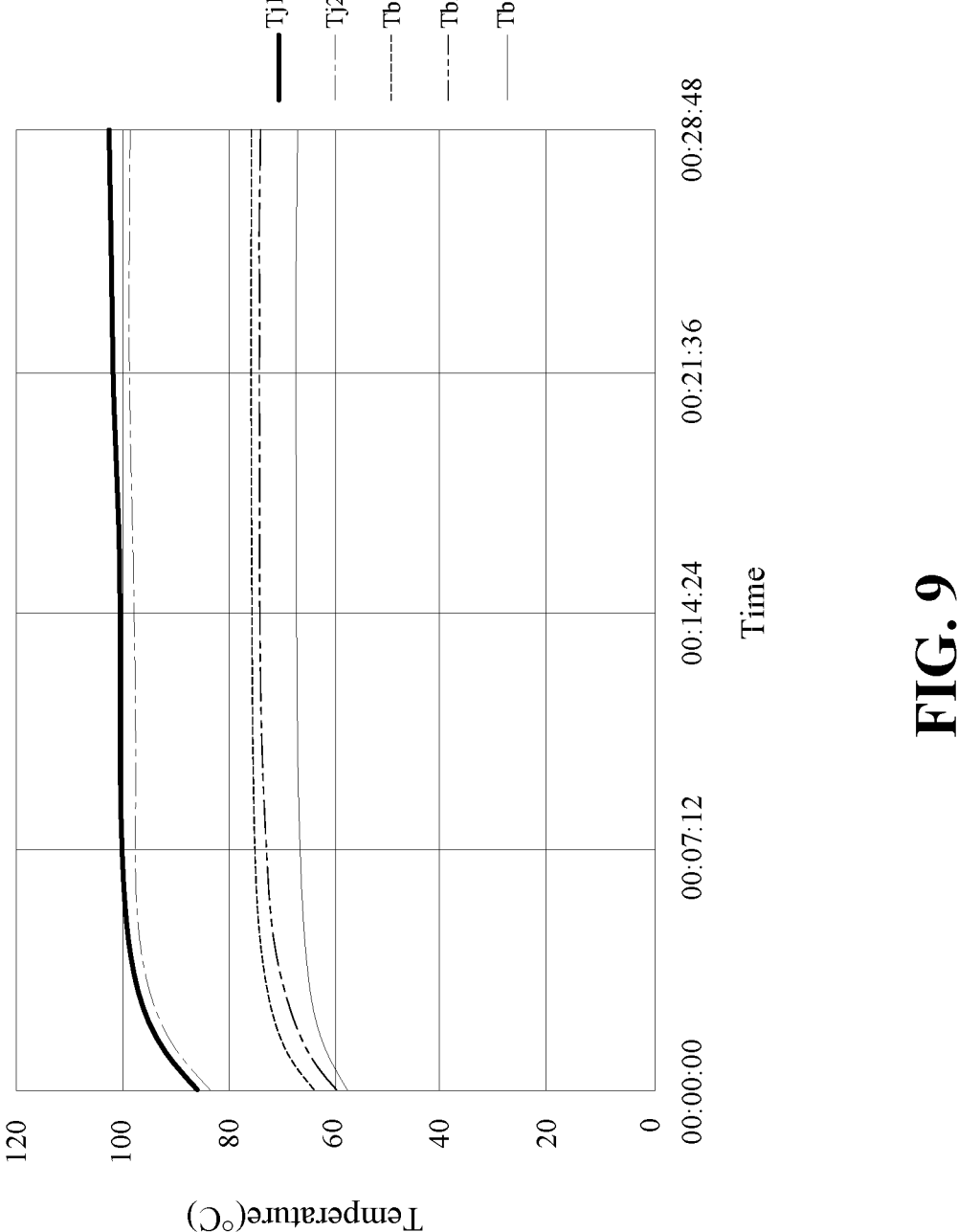

FIG. 9 is a comparison chart of the test results between the present invention and the conventional technology under the condition that the ambient temperature is 55° C. and the fan speed is 20 RPM. Tj1 is the core temperature of the IC chip of the control module of the conventional high-frequency high-speed transmission cable module, Tj2 is the core temperature of the IC chip of the control module 3 of the high-frequency high-speed transmission cable module of the present invention, Tb1 is the temperature of the measurement point P1 of the heat dissipation block of the upper cover of the high-frequency high-speed transmission cable module of the present invention, Tb2 is the temperature of the first end portion of the main body of the upper cover of the conventional high-frequency high-speed transmission cable module, and Tb3 is the temperature at the measuring point P2 at the first end portion of the main body of the upper cover of the high-frequency high-speed transmission cable module of the present invention. As shown in FIG. 9, Tj1>Tj2, and Tb1>Tb2>Tb3. The above results show that under the conditions of an ambient temperature of 55° C. and a fan speed of 20 RPM, the heat dissipation efficiency of the present invention is significantly better than that of the conventional technology.

More specifically, as shown in FIG. 9, during the start-up period (i.e., before 7 minutes and 12 seconds), the core temperature of the IC chip is still rising because the heat generated by the control module is still accumulating. At this time, $\text{Tj1}-\text{Tj2} \geq 2° \text{C.}$, the difference between Tb1 and Tb2 is larger, and the difference between Tb2 and Tb3 is smaller. As shown in FIG. 9, during the equilibrium period (i.e., after 21 minutes and 36 seconds), since the heat generated during the operation of the control module reaches an equilibrium state, the core temperature of the IC chip will not rise again. At this time, $Tj1-Tj2 \geq 3.5°$ C., the difference between Tb1 and Tb2 is smaller ($Tb1-Tb2 \geq 1°$ C.), and the difference between Tb2 and Tb3 is larger.

In addition, when Tb2 is fixed at 70° C. and the fan speed is 24 RPM, Tj1 is 98° C.; when Tb1 is fixed at 70° C. and the fan speed is 30 RPM, Tj2 is 92° C. At this time, $Tj1>Tj2$. The above results show that the heat dissipation efficiency of the present invention is clearly better than that of the conventional technology under the condition that the temperature of the measurement point is fixed at 70° C.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A high-frequency high-speed transmission cable module, comprising:

a cover body, comprising an upper cover and a lower cover, the upper cover further comprising a main body and a heat dissipation block, the main body having a first end portion and a second end portion in a length direction of the main body, the lower cover further having a first end portion and a second end portion in a length direction of the lower cover;

a cable, one end of the cable being accommodated in the second end portion of the main body and the second end portion of the lower cover in the cover body;

a control module, disposed inside the first end portion of the main body and the first end portion of the lower cover in the cover body and located under the heat dissipation block;

wherein the first end portion of the main body is disposed with a through hole, an inner wall of the through hole is disposed with a protruding support portion, the protruding support portion divides the through hole into an upper passage and a lower passage connected by a connecting passage, the upper passage passes through a top surface of the first end portion of the main body, and the lower passage passes through a bottom surface of the first end portion of the main body;

wherein the heat dissipation block is embedded in the through hole and includes an upper portion, a middle portion and a lower portion, the upper portion is located in the upper passage and exposed through the top surface of the first end portion of the main body with an edge portion of the upper portion in contact with and supported by the protruding support portion, the middle portion is disposed in the connecting passage, the lower portion is located in the lower passage, and a portion of a bottom surface of the middle portion is exposed directly above a topmost surface of the control module; and wherein the control module is located under the lower portion of the heat dissipation block, a top surface of the upper portion of the heat dissipation block is in contact with heat dissipation fins of a casing to transfer heat generated by the control module through the heat dissipation block to the heat dissipation fins, and a bottom surface of the edge portion abuts against the protruding support portion so that the protruding support portion and the first end portion of the main body absorb and transfer the heat to the second end portion of the main body and dissipate the heat through a plurality of grooves formed on the second end portion of the main body.

2. The high-frequency high-speed transmission cable module according to claim 1, wherein a top surface of the second end portion of the main body is higher than the top surface of the first end portion of the main body.

3. The high-frequency high-speed transmission cable module according to claim 2, wherein two sides along the length direction of the main body are respectively defined as a first side and a second side, and two grooves in the plurality of grooves respectively closest to the first and second sides of the main body both have a depth smaller than the depths of all the remaining grooves.

4. The high-frequency high-speed transmission cable module according to claim 3, wherein the depth of the remaining grooves is 1.5 mm.

5. The high-frequency high-speed transmission cable module according to claim 1, wherein a partition is disposed between two adjacent grooves of the plurality of grooves, the partition has a plurality of protrusions, and the protrusions respectively protrude from two sides of the partition.

6. The high-frequency high-speed transmission cable module according to claim 5, wherein the plurality of protrusions on two adjacent partitions are arranged in a staggered manner.

7. The high-frequency high-speed transmission cable module according to claim 5, wherein the protrusions are arranged in pairs.

8. The high-frequency high-speed transmission cable module according to claim 1, wherein a diameter of the upper portion of the heat dissipation block is greater than the diameter of the middle portion of the heat dissipation block, and the diameter of the middle portion of the heat dissipation block is greater than the diameter of the lower portion of the heat dissipation block.

9. The high-frequency high-speed transmission cable module according to claim 1, wherein a diameter of the topmost surface of the control module is greater than a diameter of the lower portion of the heat dissipation block.

\* \* \* \* \*